United States Patent [19]

Hunter et al.

[11] Patent Number: 4,954,216
[45] Date of Patent: Sep. 4, 1990

[54] PROCESS OF MAKING THIN FILM VECTOR MAGNETOMETER

[75] Inventors: Paul Hunter, Burtonsville; Leonard J. Schwee, Silver Spring, both of Md.

[73] Assignee: The United States of America as represented by the Secretary of the Navy, Washington, D.C.

[21] Appl. No.: 456,231

[22] Filed: Dec. 26, 1989

Related U.S. Application Data

[63] Continuation of Ser. No. 623,893, Jun. 25, 1984, abandoned.

[51] Int. Cl.$^5$ .............................. C23F 1/02; B44C 1/22; C03C 15/00; C03C 25/06
[52] U.S. Cl. .................................. 156/634; 156/656; 156/659.1; 156/901; 324/249; 324/252
[58] Field of Search ................ 156/629, 633, 634, 653, 156/656, 657, 659.1; 324/244, 249, 252; 29/610.1, 620; 427/131, 132

[56] References Cited

U.S. PATENT DOCUMENTS 3,405,355 10/1968 Hebbert .............................. 324/46
3,546,579 12/1970 Paul et al. ........................... 324/46

OTHER PUBLICATIONS

Review of Scientific Instruments, vol. 37, No. 10, pp. 1321-1323, Oct. 1966, Thin Film Magnetoresistance Magnetometer, Hebbert et al.

*Primary Examiner*—William A. Powell
*Attorney, Agent, or Firm*—Kenneth E. Walden; Jacob Shuster

[57] ABSTRACT

A thin film vector magnetometer is configured to produce an output that varies linearly with the component of an externally applied magnetic field in the plane of a thin film chip portion thereof along a predefined sensitivity axis. The sensitivity and linear dynamic range of the thin film vector magnetometer are intimately related to each other through a bias field supplied by a bias magnet portion of the device. The bias field also defines the sensitivity axis of the magnetometer which is orthogonal to the unidirectional bias field applied by the bias magnet.

16 Claims, 1 Drawing Sheet

PROCESS OF MAKING THIN FILM VECTOR MAGNETOMETER

This application is a continuation of application Ser. No. 623,893, filed June 25, 1984, abandoned

BACKGROUND OF THE INVENTION

1. Field of the Invention

The present invention relates generally to magnetoresistive sensors, but more particlarly it relates to an improved thin film vector magnetometer that produces an output voltage which varies linearly with the component of magnetic field in the plane of the thin film, of which it is fabricated, along a predetermined sensitivity axis.

2. Description of the prior Art

The detection of magnetic fields is a common function required of many systems. Magnetometers of various types are found in torpedoes, mines, buoys, intrusion detectors, vehicle detectors, and magnetic anomaly detectors to name a few systems. Accordingly, there are wide ranges in the levels, dynamic ranges, and frequency of the magnetic fields which must be detected. In addition, system level requirements impose contraints such as a the maximum power comsumption, physical size and operational conditions, e.g., temperature and ambient noise.

Several high film magnetometers are disclosed in the prior art. In the publication to, R.S. Hebbert and L.J. Schwee, "Thin Film Mangetoresistance Magnetometer", The Reveiw Of Scientific Instruments, Vol. 37, No. 10, pp. 1321-1323, Oct. 1966, there is disclosed a magnetometer that uses an etched thin film layer arranged in a Wheatstone bridge configuration. The magnetoresistive properties of the thin film layer is used to provide a resistance change in the arms of the Wheatstone bridge when subjected to a dynamic magnetic field. The dynamic magnetic field produces an imbalance in the arms of the bridge. This imbalance is a function of the intensity of the dynamic magnetic field thereby providing a corresponding output signal amplitude. The thin film layer is arranged apparently with its easy axis aligned orthogonal to a constant hard axis bias field. The bias field is applied parallel to the plane of the thin film layer and is of an intensity much greater than the anisotropy field $H_K$ of the thin film layer. This arrangement, due to the fast domain switching characteristics of the thin film layer, has an inherently fast response time having a stated flat response to dynamic magnetic fields of frequencies in the order of 65 MHz.

Paul et al, in U.S. Pat. No. 3,546,579, patented on Dec. 8, 1970, disclose a magnetometer that uses four anisotropic thin films arranged in a Wheatstone bridge configuration. The magnetoresistive properties of the thin films are used to change the resistance in arms of the bridge when subjected to a dynamic magnetic field. The four thin films are arranged with their easy axes aligned orthogonally to a constant hard axis bias filed. The pair of thin films in the balancing legs of the bridge are subjected to bias fields of opposite polarities such that the bridge network is rendered substantially insensitive to ambient or other hard axis field components. Paul el al consider their bias scheme to be an improvement over bias scheme used by Hebbert and Schwee, aforementiond.

In practice, the foregoing magnetometers suffer from several problems. In both the Hebbert et al and Paul el al magnetometers, size and impedance are critical factors in that the device are larger and have lower impedances than desired. Also, in the Paul et al magnetometer, there is a question of whether there is a practical technique for fabricating their Wheatstone bridge using multiple bias fields. Thus, the problem presented is to maintain their self-cancelling feature while producing a magnetometer that is small in physical size.

Consequently, there is a need in the prior art to configure a thin film vector magnetometer that can produce an output voltage which varies linearly with the component of a magnetic field in the plane of the thin film along a predetermined sensitivity axis while maintaining low power consumption and miniaturization of the finished product.

The prior art, as indicated hereinabove, include some advancements in thin film vector magnetometers. However, insofar as can be determined, no prior art thin film vector magnetometer incorporates all of the features and advancements of the folded track present invention.

OBJECTS OF THE INVENTION

Accordingly, an important object of the present invention is to configure a thin film vector magnetometer that will produce an output voltage which varies linearly with the component of magnetometer field in the plane of the thin film along a predefined sensitivity axis while maintaining low power consumption and miniaturization.

A further object of the present invention is to accomplish the foregoing object while optimizing the sensitivity and linear dynamic range of the thin film vector magnetometer.

Another object of the present invention is to configure the thin film vector magnetometer to be economic in design and amenable to the mass production techniques used in thin film processing.

Still another object of the present invention is to optimize the magnetic material geometry of the chip portion of the thin film vector magnetometer so as to increase the sensitivity and linearity thereof.

SUMMARY OF THE INVENTION

In accordance with the above stated objects, other objects, features and advantages the present invention has as a primary purpose the fabrication of a thin film vector magnetometer that will produce output voltage which varies linearly with the component of magnetic field in the plane of the thin film along a predetermined sensitivity axis.

The essence of the present invention is in designing the thin film vector magnetometer so that its properties such as sensitivity, linear dynamic range, power consumption and physical size can be tailored to specific applications.

The purpose of the present invention is carried out by configuring the thin film vector magnetometer to include a magnetoresistive bridge, a thin film chip carrier and a bias magnet. In fabricating the unique geometry of the magnetoresistive bridge, permalloy (nickel-iron) is used. To fabricate the magnetoresistive bridge, a set of two photolitographic masks are necessary. One mask is used in etching the permalloy level. The second mask is used to define vias in a passivation level through a photolithograhic process and to etch electrical bonding pads in an aluminum-copper level deposited after the passivation step.

The thin film vector magnetometer is completed by connecting trim resistors to the magnetoresistive bridge grounding one end thereof and attaching a power source to the other end thereof so as to form a Wheatstone bridge configuration. The magnetoresistive bridge is affixed to the thin film chip carrier and the bias magnet is affixed to the top of the thin film chip carrier so as to apply a constant bias field which is oriented orthogonal to the easy axis of the magnetoresistive bridge. The thin film vector magnetometer, as configured, is most sensitive to signal fields having the same relative alignment as the easy axis of the magnetoresistive bridge. Its output varies with the vector component of the signal field as referenced to the easy axis.

BREIF DESCRIPTION OF THE DRAWINGS

The foregoing and other objects, novel features and advantages of the present invention will be more apparent from the following more particular description of the preferred embodiment as illustrated in the accompanying drawings, in which.

DESCRIPTION OF THE PREFERRED EMBODIMENT

The following is a description of a thin film vector magnetometer employing the present invention to produce an output voltage that varies linearly with the component of a magnetic field in the plane thereof along a predefined sensitivity axis. A description of a process of fabricating a thin film chip portion thereof is also discussed in some detail.

Figure 1:
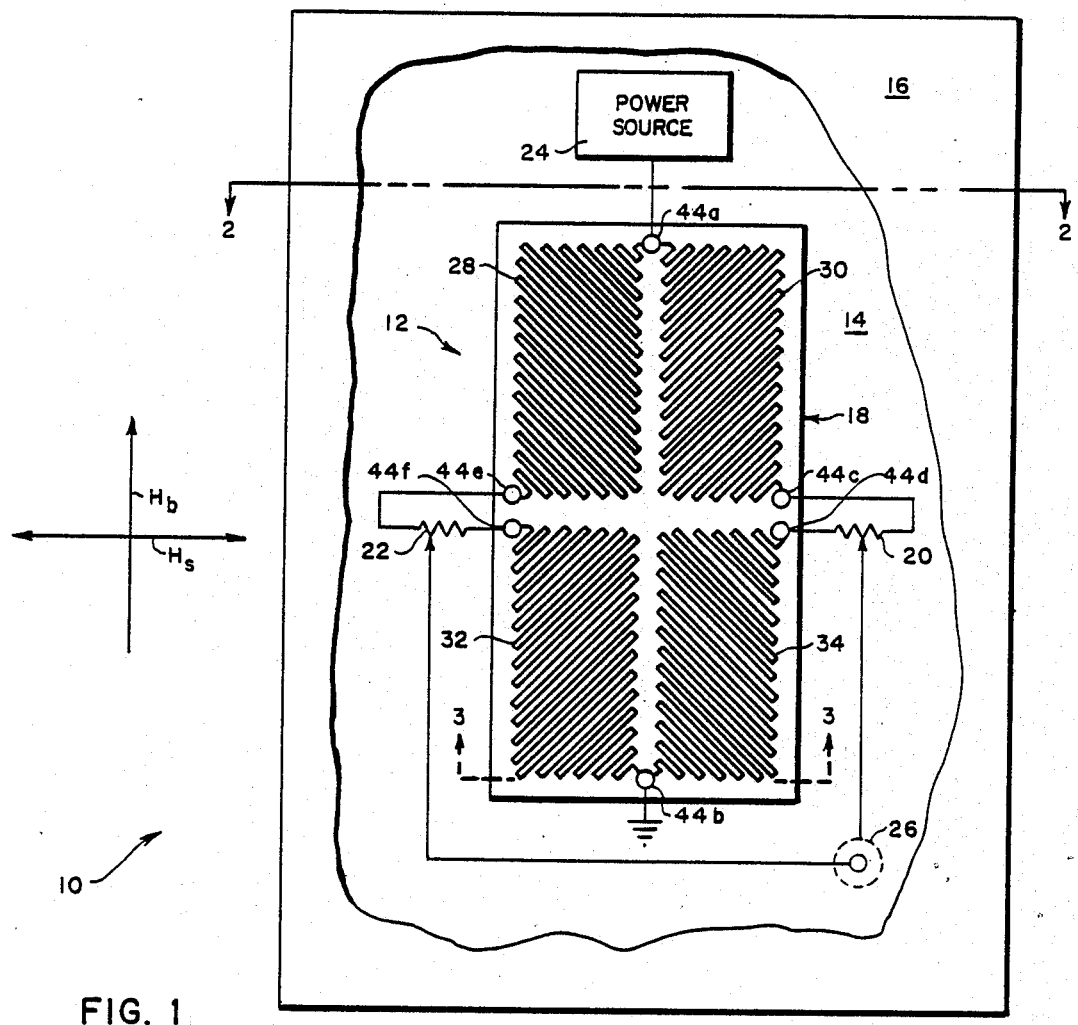
FIG. 1 is a partially cutaway schematic representation of a thin film vector magnetometer, according to the present invention, illustrating, inter alia, a magnetoresistive bridge including a thin film chip having a plurality of magnetoresistors, a thin film chip carrier and a bias magnet.
Figure 2:
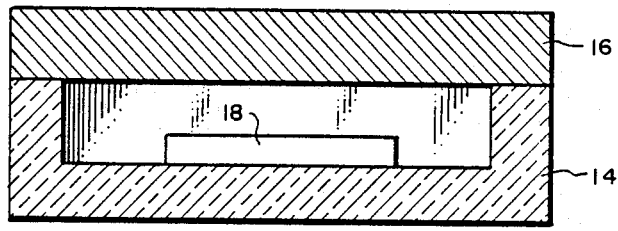
FIG. 2 is a sectional view illustrating the physical relationship of the thin film chip, the thin film chip carrier and the bias magnet of FIG. 1, taken along lines 2—2 thereof.

Referring then to FIGS. 1 and 2 as viewed concurrently, a thin film vector magnetometer 10 comprises a magnetoresistive bridge 12 which is configured in a traditional Wheatstone bridge topography, a thin film chip carrier 14 of a ceramic material in which the magnetoresistive bridge 12 is affixed, and a bias magnet 16 configured to be affixed to the thin film chip carrier 14.

The magnetoresistive bridge 12 of FIG. 1 comprises a thin film chip 18, a first trim resistor 20, a second trim resistor 22, a power source 24 and an output connector 26.

Figure 3:
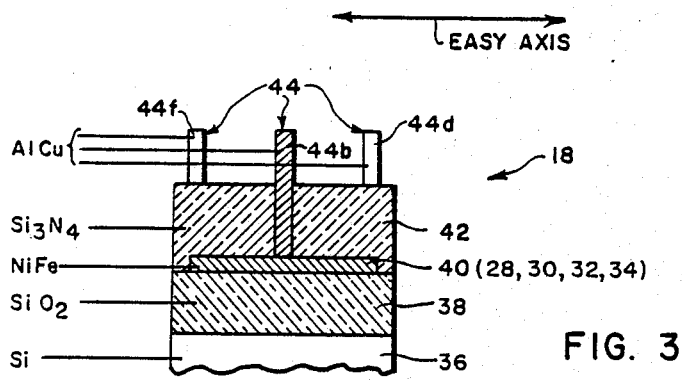
FIG. 3 is a sectional view illustrating the levels of fabricating of the thin film chip of FIG. 1, taken along lines 3—3 thereof.

Referring now to FIGS. 1 and 3 as view concurrently, the thin film chip 18 comprises a left arm magnetoresistor 28, a right arm magnetoresisitor 30, a left leg magnetoresistor 32 and a right leg magnetoresistor 34. The thin film chip 18 further comprises a substrate 36 of silicon (Si), a first level material 38 of silicon dioxide (SiO$_2$), a second level material 40 of permalloy or nickel-iron alloy a, third level material 42 of silicon nitride (Si$_3$N$_4$), and a fourth level material 44 of aluminum copper (AlCu). The fourth level material 44 includes a plurality of electrical bonding pads 44a through 44f, as shown in FIG. 1. For purposes of the present invention, the substrate 36 may be glass, and, accordingly, the first level material 38 would not be necessary. However, the use of silicon is preferred because of its superior heat sinking capability and its compatibility with integrated circuit technology.

Still referring to FIGS. 1 and 3 as viewed concurrently, a well defined easy axis in the direction shown for magnetic field Hs is produced in the magnetoresistors 28 through 34 during the deposition process. A bias field $H_B$ is produced by application of the bias magnet 16, which for the purposes of the present invention is fabricated out of a ferromagnetic material such as barium ferrite. The bias field $H_B$ also defines the sensitivity axis of the thin film magnetometer 10 in the direction shown. The sensitivity axis or the direction for maximum response to an applied magnetic field signal $H_S$ is bidirectional and orthogonal to the unidirectional hard axis of magnetic field Hs bias field $H_B$ as illustrated.

The geometry of the thin film chip 18 including the orientation of the left arm magnetoresistor 28, the right arm magnetoresistor 30, the left leg magnetoresistor 32 and the right leg magnetoresistor 34 with respect to the easy axis, the bias field $H_B$ and to each other, produces a true vector response. The foregoing is made possible by etching the right arm magnetoresistor 30 and the left leg magnetoresistor 32 such that their resistance will increase for the bias field $H_B$ direction shown and for a right directed signal field $H_S$. On the other hand, the left arm magnetoresistor 28 and the right leg magnetoresistor 34 are etched such that their resistances will decrease for the same field directions. The output of the magnetoresistive bridge 12, and accordingly, the thin film vector magnetometer 10 is produced at the output connector 26 for a power source 24 producing a constant current that flows into the electrical bonding pad 42a. The output of the magnetoresistive bridge 12 at the center conductor as referenced to the outer conductor of the output connector 26, will be positive for a signal field $H_S$ in the direction to the right. On the other hand, for a signal field $H_S$ in the direction to the left, the output at the center conductor of the output connector 26 will be negative. It has been shown, that a power source 24 comprising a constant current source allows the thin film vector magnetometer 10 to perform better with changes in temperature than with a constant voltage source. This occurs because a constant current source will compensate for the increase in the non-magnetic part of the resistance of the thin film chip 18 which increases with temperature.

Still referring to FIG. 1, some of the quality operational characteristics of thin film vector magnetometer 10 can be attributed to the geometry of the magnetoresistors 28 through 34 in respect to the easy axis. As shown, the meandering resistor lines of the left arm magnetoresistor 28 and the right leg magnetoresistor 34 are oriented at minus 45° with respect to the easy axis. Contrariwise, the meandering resistor lines of the right arm magnetoresistor 30 and the left leg magnetoresistor 32 are oriented at plus 45° with respect to the easy axes. In order to be able to balance the thin film vector magnetometer bridge 10 in actual operation, the trim resistors 20 and 22 are connected as shown and used to balance out any imbalances, due to resistances in the electrical bonding pads 44a through 44f, or mismatching in the magnetoresistors 28 through 34.

Still referring to FIGS. 1 and 2 but particularly to FIG. 3, a section view of the thin film chip 18 suitable for use in a Wheatstone bridge configuration along with a sectional view thereof are shown. In FIG. 3, the vertical scale is approximately 5000 times the horizontal scale in order to better show the levels of fabrication of the thin film chip 18. A first level of thin film chip 18 is deposited on a suitable substrate 36 of silicon. This first level comprises a silicon dioxide layer 38. A second level of the thin film chip 18 is fabricated by first depositing permalloy of 81-19 Ni-Fe using a physical vapor deposition process (either resistance heating or electron beam heating) or a sputtering process. This level which comprises a permalloy layer 40 is patterned with the mandering resistor lines and geometry depicted in the magnetoresistors 28 through 34 by using conventional photolithograhic techniques. Then the permalloy layer 40 is etched chemically or with an ion beam miller. A third level of the thin film chip 18 comprises a silicon nitride layer 42 or silicon monoxide having vias (not shown) for making connections to the magnetoresistors 28 through 34. The vias in this level are created using a lift off technique whereby photoresist plugs are moved in a heated acetone bath agitated with an ultrasonic agitator. This technique is believed to give superior stripping of the photoresist. A fourth level comprises a plurality of electrical bonding pads 44a through 44f of 95-5Al-Cu. The electrical bonding pads 44a through 44f are fabricated to corresponding arms and legs of the thin film chip 18 to form external connection points to associated circuit elements. This level is fabricated using an etching process. The Al-Cu is deposited in an ion beam coater. Then the metalization pattern is created by patterening a layer of photoresist on the areas intended to be electrical bonding pads 44a through 44f. The AlCu layer 44 is then etched to define the electrical bonding pads 44a through 44f after which the photoresist is stripped. It should be mentioned that during deposition of the permalloy lay 40 a large d.c. magnetic field is applied which produces a well defined easy axis in the permalloy layer 40, and, accordingly, the thin film chip 18. Without this d.c. magnetic field, the easy axis would be unpredictable and possibly have a high degree of dispersion. Thus, using this technique, a reproducable easy axis can be achieved.

For purposes of the present invention, the first level of silicon dioxide 38 is about 1500 Å, the second level of magnetoresistors 28 through 34 having meandering resistor lines of permalloy layer 40 is about 400 Å, the third level 44 of silicon nitride 44 is about 2000 Å and the fourth level of electrical bonding pads 44a through 44f is about 4000 Å. Also, for purposes of the present invention, the width of the thin film chip 18 is about 3.90 millimeters (mm) and the length is about 7.80 mm. The thickness of the thin film chip 18 is about 0.40 mm. The width of each of the meandering resistor lines of the magnetoresistors 28 through 34 is about 100 microns with the separation between the lines, in a particular magnetoresistor, being about 5 microns. Each of the electrical bonding pads 44a through 44f are about 0.40 mm in diameter.

The desired properties of magnetic material suitable for use with the present invention are zero magnetostriction, $H_k \sim 3.5$ Oe, $H_c \sim 1$ to 1.8 Oe, and the magnetoresistance ratio, $R/R_o$, greater than 2.3 percent. Isotropic films may also be used in the fabrication of the present invention.

To those skilled in the art, many modifications and variations of the present invention are possible in light of the above teachings. It is therefore to be understood that the present invention can be practiced than otherwise than as specifically described herein and still be within the spirit and scope of the appended claims.

What is claimed is:

1. A process of fabricating a thin film vector magnetometer, comprising the steps of:
   (1) fabricating a magnetoresistive bridge including the steps of;
   (1a) fashioning a suitable substrate for fabrication thereon;
   (1b) depositing a magnetic material to a predetermined thickness onto said suitable substrate so as to form a predetermined number of magnetoresistors each having a predetermined geometric pattern of meandering resistor lines, the depositing of said magnetic material being accomplished in the environment of a dc magnetic field so as to produce a well defined easy axis therein;
   (1c) depositing an insulating material over said magnetoresistors so as to create vias for making electrical connections thereto; and
   (1d) depositing a conducting material within the insulating material to create electrical bonding pads to said magnetoresistors;
   (2) affixing said magnetoresistive bridge to a chip carrier; and
   (3) affixing a bias magnet to said chip carrier so as to produce a bias field in said magnetoresistors of said magnetoresistive bridge orthogonal to the easy axis thereof.

2. The process of claim 1 wherein said suitable substrate is glass.

3. The process of claim 1 wherein said suitable substrate is fashioned by depositing an insulating material to a predetermined thickness onto a silicon base.

4. The process of claims 2 or 3 wherein said magnetic material comprises permalloy of 81-19 Ni-Fe having a predetermined thickness of about 400 Å.

5. The process of claim 4 wherein the step 1b further comprises the steps of:
   depositing said permalloy onto said suitable substrate to a predetermined thickness of about 400 Å; and
   etching said permalloy to form said magnetoresistors each having a predetemined geometric pattern of meandering resistor lines.

6. The process of claim 5 wherein said insulating material used in step 1c is silicon nitride having a predetermined thickness of about 2000 Å.

7. The process of claim 6 wherein said conducting material used in step 1d is 95-5 Al-Cu, and wherein the predetermined thickness about 4000 Å.

8. The process of claim 3 wherein said insulating material deposited on said silicon substrate to fashion said suitable substrate is silicon dioxide having a predetermined thickness of about 1500 Å.

9. The process of claim 5 wherein the etching step further comprises the steps of:
   creating the predetermined geometric pattern of meandering resistor lines on said permalloy such that areas not to be etched are covered with a photoresist before the etching step; and
   stripping, in a first stripping step, the photoresist from those areas of the geometric pattern containing said permalloy after the etching step.

10. The process of claim 9 wherein said first stripping step includes bathing in a heated acetone bath with ultrasonic agitation.

11. The process of claim 6 wherein the step 1c further comprises the steps of:

creating the vias according to a predetermined pattern on said permalloy by covering those areas to contain the vias with a photoresist before depositing said insulating material; and stripping, in a second stripping step, the photoresist after depositing said insulating material thereby creating the vias.

12. The process of claim 11 wherein said second stripping step includes bathing in a heated acetone bath with ultrasonic agitation.

13. The process of claim 7 wherein the step 1d further comprises the steps of:

covering those areas of said conducting material corresponding to the vias with a photoresist;

etching the conducting material down to the level of the insulating material used in the step 1c; and stripping, in a third stripping step, the photoresist thereby creating said electrical bonding pads.

14. The process of claim 13 wherein said third stripping step includes bathing in a heated acetone bath with ultrasonic agitation.

15. The process of claim 1 wherein said chip carrier is fabricated of a ceramic material.

16. The process of claim 1 wherein said bias magnet is fabricated of barium ferrite.

* * * * *